United States Patent [19]

Olson

[11] Patent Number: 5,679,159
[45] Date of Patent: Oct. 21, 1997

[54] SPINNING SUBSTRATE HOLDER FOR CUTTING TOOL INSERTS FOR IMPROVED ARC-JET DIAMOND DEPOSITION

[75] Inventor: James M. Olson, Framingham, Mass.

[73] Assignee: Saint-Gobain/Norton Industrial Ceramics Corporation, Worcester, Mass.

[21] Appl. No.: 473,198

[22] Filed: Jun. 7, 1995

[51] Int. Cl.⁶ .................................................. C23C 16/00
[52] U.S. Cl. ........................... 118/500; 118/728; 118/730; 118/723 DC
[58] Field of Search ............................ 118/730, 723 HC, 118/723 DC, 500, 728

[56] References Cited

U.S. PATENT DOCUMENTS

| | | | |
|---|---|---|---|
| 4,485,759 | 12/1984 | Brandolf | 118/730 |
| 4,858,558 | 8/1989 | Ohmura | 118/730 |
| 5,096,736 | 3/1992 | Anthony | 118/723 HC |
| 5,152,842 | 10/1992 | Urata | 118/715 |
| 5,204,145 | 4/1993 | Gasworth | 427/577 |
| 5,256,205 | 10/1993 | Schmitt, III et al. | 118/723 |
| 5,342,660 | 8/1994 | Cann | 118/730 |
| 5,382,293 | 1/1995 | Kawarada | 118/730 |
| 5,529,633 | 6/1996 | Ennis | 118/730 |

FOREIGN PATENT DOCUMENTS

| | | |
|---|---|---|
| 0 378 230 | 7/1990 | European Pat. Off. . |
| 442 303 | 8/1991 | European Pat. Off. . |
| 493609 | 7/1992 | European Pat. Off. ........ 118/723 HC |
| 0 597 445 | 5/1994 | European Pat. Off. . |
| 0 636 706 | 2/1995 | European Pat. Off. . |

Primary Examiner—Richard Bueker
Attorney, Agent, or Firm—Volker R. Ulbrich; David P. Gordon

[57] ABSTRACT

A mandrel for use in an arc-jet spinning diamond deposition process for coating cutting tool inserts is disclosed. The mandrel has a plurality of cutouts or wells for receiving cutting tool inserts. The receiving wells are machined or otherwise provided to have the same contour as the cutting tool inserts that are placed in the wells. The receiving wells may all have an identical geometry, or different geometries. In one embodiment, the mandrel comprises a single element with the receiving wells machined into the upper surface of the mandrel. In another embodiment, the mandrel comprises a separate upper plate with the receiving wells cut through the plate to form a grid, and a lower base plate which is attached to the upper plate. An intermediate layer of a low melting metal foil may be placed between the grid and base plate to aid adhesion and to provide an interface of high thermal conductivity.

17 Claims, 4 Drawing Sheets

SPINNING SUBSTRATE HOLDER FOR CUTTING TOOL INSERTS FOR IMPROVED ARC-JET DIAMOND DEPOSITION

BACKGROUND OF THE INVENTION

1. Field of the Invention

This invention relates broadly to diamond film coating of objects. More particularly, this invention relates to a mandrel apparatus and a method utilizing the mandrel apparatus for the simultaneous diamond film coating of a plurality of cutting tools.

2. State of the Art

Diamond has exceptional hardness, thermal conductivity, electrical insulation and light transmission properties, and is therefore useful in various applications such as cutting tools, heat sinks, insulators, electronic substrate materials, etc. Natural diamond, however, is monocrystalline and limited in size and geometry. As a result, a number of techniques have recently been developed, such as high pressure high temperature deposition (HPHT) and chemical vapor deposition (CVD), for synthesizing and depositing diamond on substrates of various shapes, sizes and materials.

Synthetic CVD diamond film can be deposited as a thin and permanent coating on a substrate, such as on the wear surface of a tool or an environmentally protective coating. When a CVD diamond film is deposited in this manner, it is generally referred to as a "thin film". Thin film CVD diamond deposition is one method of the art used in forming cutting tools. Alternatively, a thicker diamond film can be deposited on a substrate and then removed, preferably intact, as a single "free standing" piece for use in applications such as heat sinks, optical windows, and cutting tools. These free standing pieces are usually referred to as "thick films".

In the forming of thick diamond films, titanium nitride coated molybdenum and other materials having similar properties, such as titanium-zirconium-molybdenum alloys and tungsten, have traditionally been used as a substrate (mandrel) upon which synthetic diamond is to be deposited. The mandrel configuration of the prior art has generally been of the mesa type with a circular base portion and a stepped circular upper portion of a smaller size than the base portion. The size of such a mandrel has generally been of the order of about 3.5 to 4 inches in diameter. After a diamond film is deposited on such a mandrel, the diamond separates during cooling and detaches from the mesa surface, forming a free standing diamond film, which may be used to form cutting tools by attaching the diamond film to a metal base tool structure in a known manner.

While the thick diamond films of the prior art solve various needs of the art, it will be appreciated that the cost of generating the thick diamond film and attaching it to a cutting tool is large due to slow growth rates, low yield, etc. Thus, there still exists a need for a low cost, high-yield process to produce diamond film coated products such as cutting tool inserts, whether via thin film or thick film technology.

SUMMARY OF THE INVENTION

It is therefore an object of the invention to provide an apparatus and method for depositing a thin diamond film on a plurality of substrates in an efficient manner.

It is also an object of the invention to provide an apparatus and method for depositing diamond film on a plurality of spinning cutting tool inserts.

It is a further object of the invention to provide a mandrel adapted to allow the simultaneous diamond coating of a plurality of substrates fitting on the mandrel surface.

It is also an object of the invention to provide a mandrel used in a diamond film deposition process which has a plurality of tool insert receiving wells.

In accordance with the objects of the invention, which will be discussed in detail below, the invention comprises a mandrel which is preferably adapted for use in a spinning synthetic diamond deposition apparatus, such as an arc-jet apparatus. The mandrel has a plurality of receiving wells in its surface which is to be exposed to a diamond growth species or plasma, with the wells having substantially the same contour (i.e., side shapes) as the tool inserts which are to be received therein and coated with a diamond film. In accord with a first embodiment of the invention, the mandrel is a titanium-nitride coated molybdenum body into which a plurality of pockets or wells are machined. In a second embodiment, the mandrel is formed as a layered composite of a flat surfaced mandrel base, to which is attached an upper plate of a lesser thickness than the mandrel base. The upper plate is preferably formed of molybdenum and is provided with receiving wells which are cut through the plate to form a grid. In the second embodiment, a thin layer (foil) of a low melting metal may be provided between the mandrel base and the grid. The upper plate, the foil, and the grid are preferably attached to each other by bolts or other suitable means.

According to a preferred aspect of the invention, the pockets or wells of either embodiment may be provided with identical or differing geometries, provided that the geometries match those of the substrates to be coated. It will be appreciated that the second embodiment of the invention is particularly suited to providing pockets of different geometries, as it is relatively simple to make cut-outs of different geometries to suit various needs.

With the mandrels of the invention as described, the cutting tool inserts which are coated with the diamond growth species or plasma are cooled by direct radiation from the inserts as well as by conduction. In particular, a narrow gap is formed between the inserts and the mandrel when the inserts are located in their receiving wells. Since there is some gas trapped in between the inserts and their wells, and since the gas is mostly hydrogen, a very good thermal conductor, the thermal coupling of the inserts to the mandrel is very good.

Additional objects and advantages of the invention will become apparent to those skilled in the art upon reference to the detailed description taken in conjunction with the provided figures.

DETAILED DESCRIPTION OF THE PREFERRED EMBODIMENT

Figure 1:
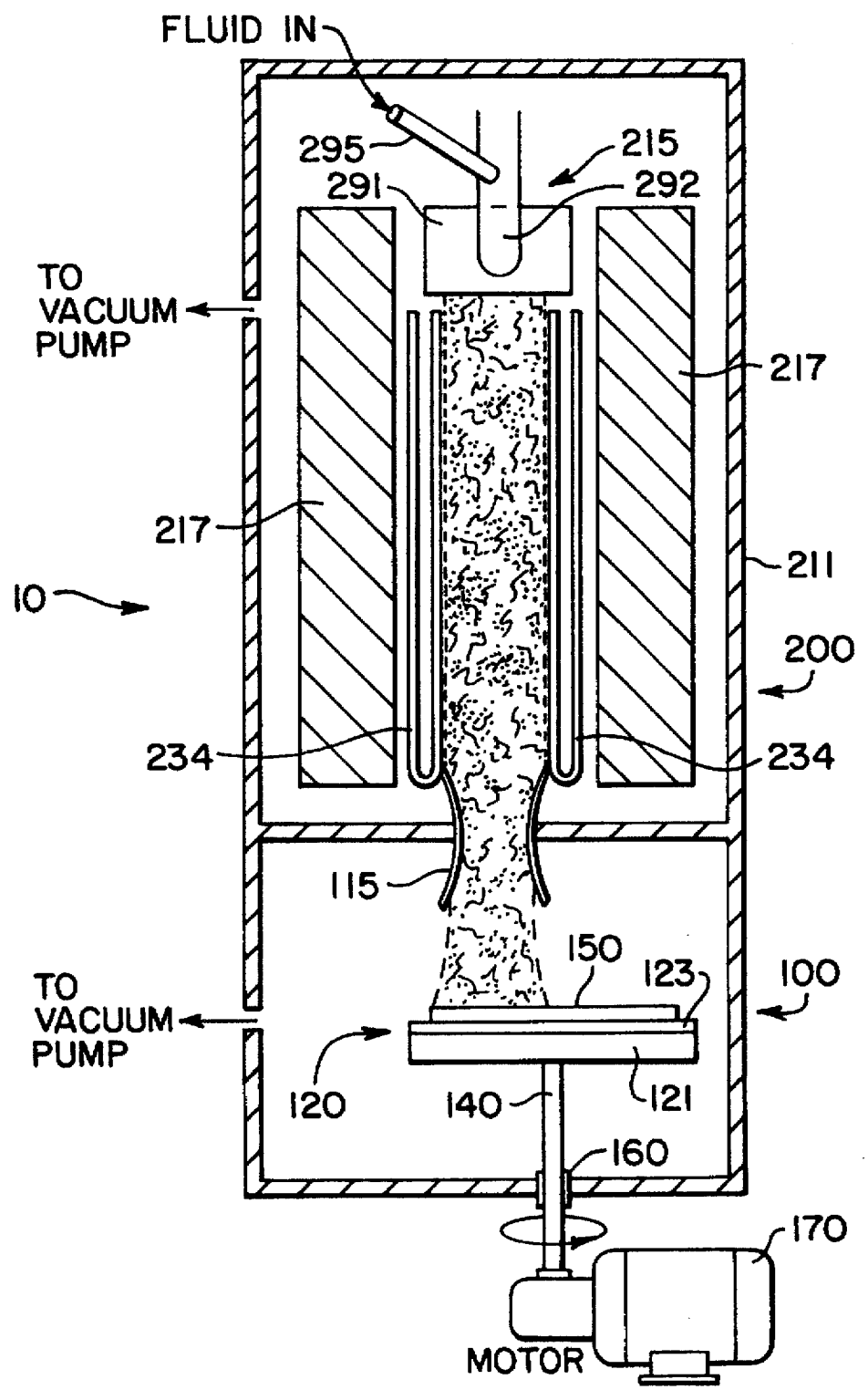
FIG. 1 is a schematic cross-sectional view in elevation of an arc-jet coating apparatus with a spinning mandrel.
Figure 2:
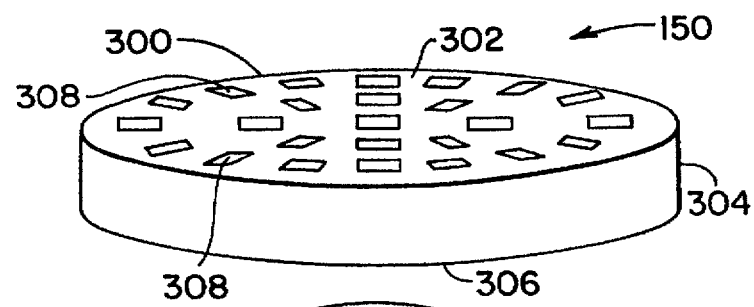
FIG. 2 is a perspective view of a first embodiment of the invention showing a cylindrical mandrel with machined wells.

An arc-jet apparatus 10 which can be used in conjunction with the invention is seen in FIG. 1. The apparatus 10 of FIG. 1 includes a lower deposition chamber 100 and an upper plasma forming chamber 200. The upper chamber includes vacuum housing walls 211, within which are located an arc-forming section 215, cylindrical magnets 218, and cooling coils 234. The arc-forming section 215 includes a cylindrical anode 291 and a rod-like cathode 292 which are energized by a source of electric potential (not shown), and an injector 295 mounted adjacent the cathode so as to permit injected fluid to pass over the cathode. In the illustrated embodiment the input fluid may be, for example, a mixture of hydrogen and methane, although the methane could alternatively be fed in downstream. The cylindrical magnets 217 are utilized to accelerate and focus the plasma generated at the arc forming section toward the lower deposition chamber 100 as the magnets maintain the plasma within a narrow column until the plasma reaches the deposition region. A nozzle 115 which connects the upper and lower chambers 200, 100 is preferably provided to control the arc-jet beam size.

As seen in FIG. 1, the deposition chamber 100 contains a substrate holder 120 which includes a base 121, and a radiator 123 or other suitable, necessary, or desired device mounted on the base. The holder 120 is mounted on a shaft 140 which is rotated by a motor 170, and the mandrel 150 of the present invention is mounted on the holder 120, such as by retainer bolts (not shown).

In operation, a mixture of hydrogen and methane is fed to the injector 295 of the plasma forming chamber 100, and a plasma is obtained in front of the arc-forming section 215 and accelerated and focused toward the deposition chamber 100 via the nozzle 115. As is known in the art, synthetic polycrystalline diamond can be formed from the described plasma, as the carbon in the methane is selectively deposited as diamond on an appropriate substrate, and the graphite which forms in the process is dissipated by combination with the hydrogen facilitating gas.

It will be understood that other suitable types of plasma beam or growth species depositing equipment can be used in conjunction with the features of the invention described hereinafter. In fact, the invention may be used in conjunction with microwave synthetic diamond deposition equipment such as described, e.g., in U.S. Pat. No. 4,728,863 to Wertheimer, and in conjunction with other low velocity or stagnant gas species such as hot filament equipment. It should be appreciated, however, that the invention as described hereinafter is most particularly suited for high speed spinning applications such as the arc jet.

Figure 3:
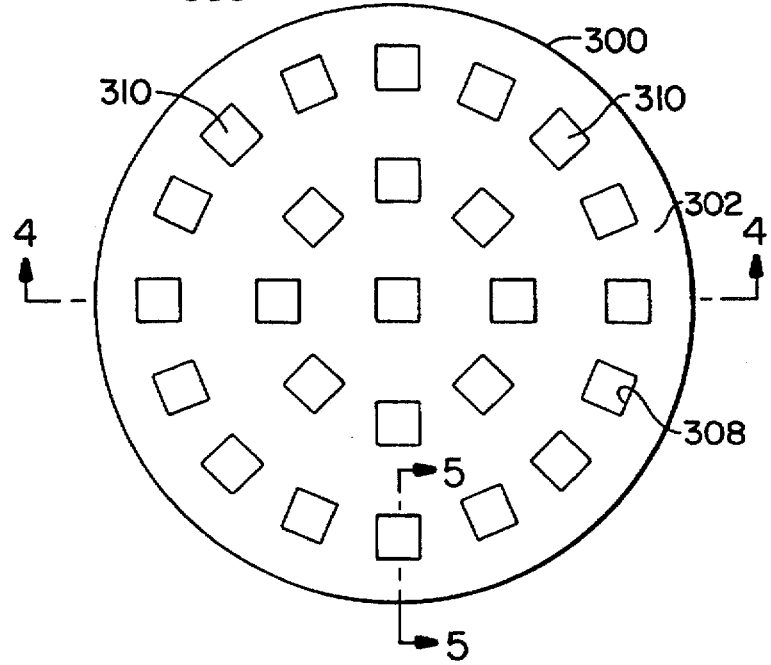
FIG. 3 is a top plan view of the embodiment of FIG. 2 with tool inserts located in the receiving wells of the mandrel.
Figure 4:
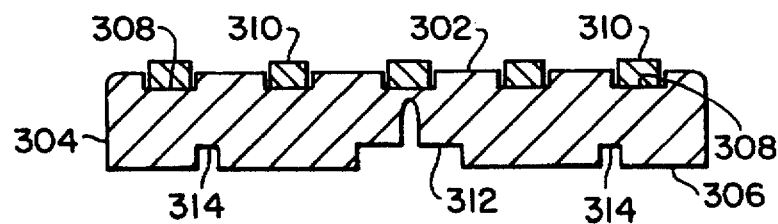
FIG. 4 is an elevational view in cross-section taken along the line 4—4 of FIG. 3.

FIGS. 2–5 show in more detail a first embodiment of the mandrel 150 of the present invention. The mandrel 150 has a circular perimeter 300, an upper surface 302, a sidewall 304, and a lower surface 306. A plurality of receiving wells or pockets 308 are machined into upper surface 302 of mandrel 150. As may be seen from FIGS. 2 and 3, the first embodiment of the mandrel of the invention has a plurality of substantially identically contoured receiving wells 308 which receive a plurality of substantially identical tool inserts 310. The conformity of the contour of the inserts 310 to the receiving wells 308 is seen in FIG. 4, with the inserts preferably extending above the upper surface 302 of the mandrel. The extent to which the inserts extend above the upper surface 302 of the mandrel is determined at least partially by the extent to which it is desired to coat the flank of the tool inserts 310. Thus, for a tool insert having a thickness of 3 mm, it may be desired to provide a coated flank of 2 mm as measured from the top surface; and as a result, the tool inserts would be arranged to extend approximately 2 mm out from the receiving wells. In addition, and as discussed in more detail with reference to FIGS. 9–11, by providing the wells with exaggerated corners, it is possible to ensure that the entire cutting edge of the tool inserts will be coated with a diamond film.

Returning to FIG. 4, it is seen that an indent 312 for a thermocouple (not shown) is preferably provided in the lower surface 306 of the mandrel 150. A plurality of bolt holes 314 which may be threaded if desired are also provided to attach the mandrel 150 to the holder 120 (see FIG. 1) of the arc-jet apparatus. By way of example only, the mandrel 150 may be about one inch in thickness, and the receiving wells may be about 0.030 to 0.050 inches (i.e., about 1 mm) in depth. The invention, however, is not intended to be limited to these parameters.

Figure 5:
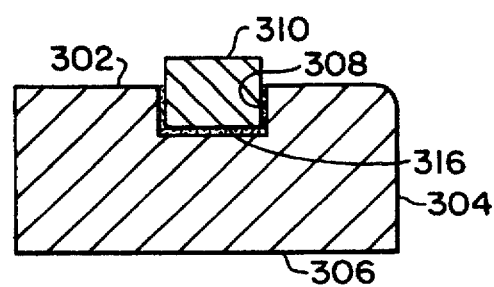
FIG. 5 is an enlarged view in elevation of a part of the cross-sectional view of FIG. 4, taken along the line 5—5 of FIG. 3.

FIG. 5 shows a cross-section in greater detail through mandrel 150 and one insert 310, taken along the line 5—5 of FIG. 3. A layer of gas 316, trapped between the conforming surfaces of the tool insert 310 and receiving well 308 is shown in FIG. 5. The gas layer 316, which is mostly hydrogen, is formed during the arc-jet deposition process, and forms a good thermal conductor. The mandrel 150 is typically formed from a titanium nitride coated molybdenum substrate which provides a stable fixture upon which the inserts 310 are held without masking the area to be coated. The uncoated cutting tool inserts (typically formed from tungsten-carbide) are held in place by the wells 308 formed in the mandrel to such a degree that they can be spun at speeds greater than 300 rpm in the direct path of the plasma beam discharge area.

Figure 6:
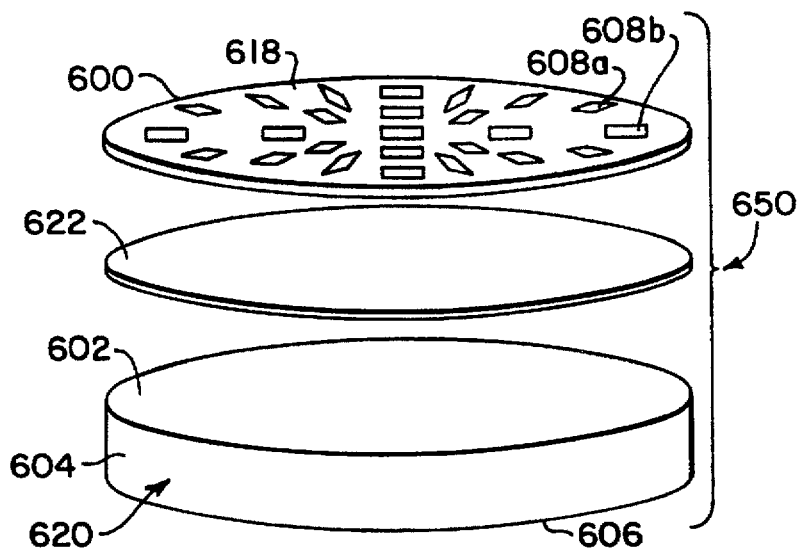
FIG. 6 is an exploded perspective view of a second embodiment of the present invention showing a composite mandrel.
Figure 7:
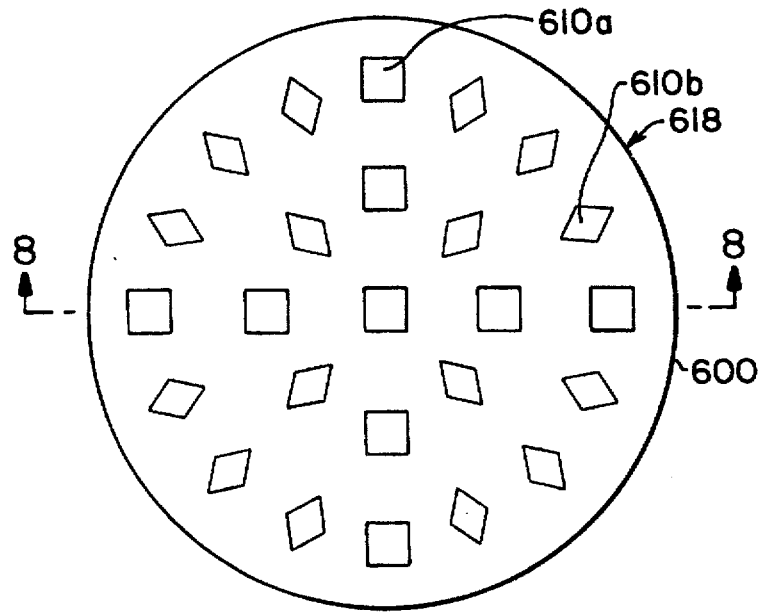
FIG. 7 is a top plan view of the grid of FIG. 6.
Figure 8:
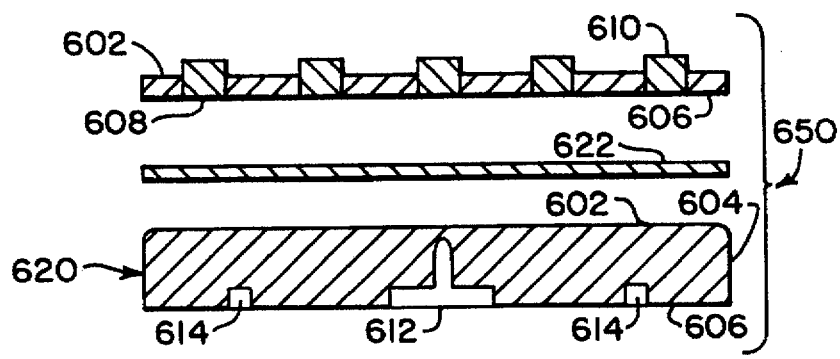
FIG. 8 is an exploded cross-sectional view in elevation of the composite mandrel of FIG. 6.

A second embodiment of the present invention is shown in FIGS. 6, 7 and 8, which illustrate a composite mandrel 650. The composite mandrel 650 generally comprises a flat plate 618 and a mandrel base 620. The mandrel base 620 is made e.g., of molybdenum and has a sidewall 604 and a flat upper surface 602. The flat plate 618, which may also be made of molybdenum, has a circular perimeter 600 and has receiving wells 608 which are preferably cut through the plate 618 to form a grid. Interposed between the plate 618 and the mandrel base 620 is a metal foil layer 622. The grid 618, mandrel base 620, and foil layer 622 may be affixed to each other by means of bolts (not shown) or any other suitable means. The foil layer 622 is a low-melting point metal such as silver or germanium and acts as a liquid-metal interface between the inserts 610 and a cooling load; thereby providing an interface of high thermal conduction for the flat grid plate 618, and aiding in the adhesion of the grid 618 to the molybdenum mandrel base 620.

It should be noted that in the second embodiment of the invention, the wells 608 and the cutting tool inserts 610 are provided with at least two differing geometries as indicated at 608a, 608b.

FIG. 8 is a cross-sectional view of the composite mandrel of FIG. 6, taken along the line 8—8 of FIG. 7, and shows the metal foil layer 622, the mandrel base 620, and the inserts 610 in the receiving wells 608 of the flat grid plate 618. The lower surface 606 of the mandrel base 620 has a plurality of preferably threaded bolt holes 614 for attaching the base 620 to the holder 120 of the arc-jet apparatus, and a thermocouple receiving well 612. The flat grid plate 618 may be for example about 0.030 to 0.050 inches in thickness; foil layer 622 about 0.001 inches in thickness; and mandrel base 620 about one inch in thickness. However, the invention is not intended to be limited to these dimensions.

Figure 9:
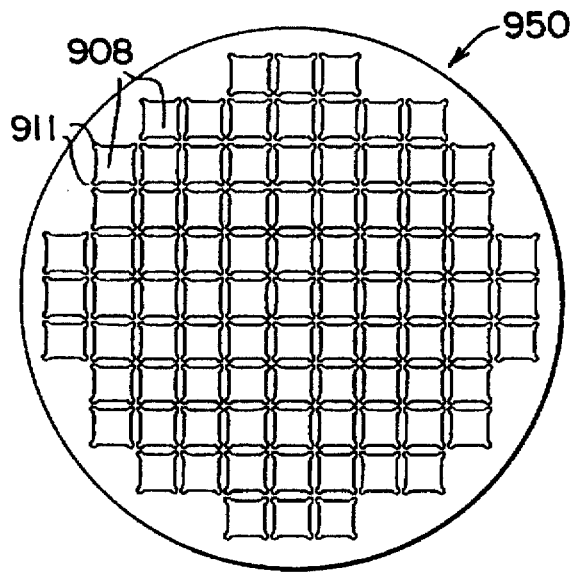
FIGS. 9–11 are top plan views of third, fourth and fifth embodiments of the invention.
Figure 10:
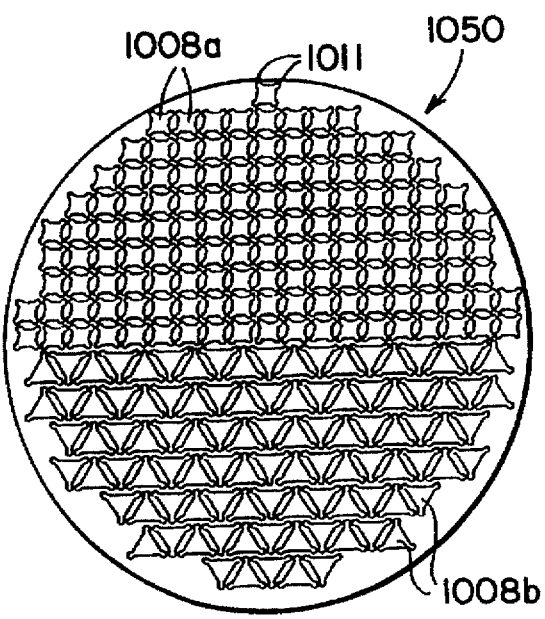
Figure 11:
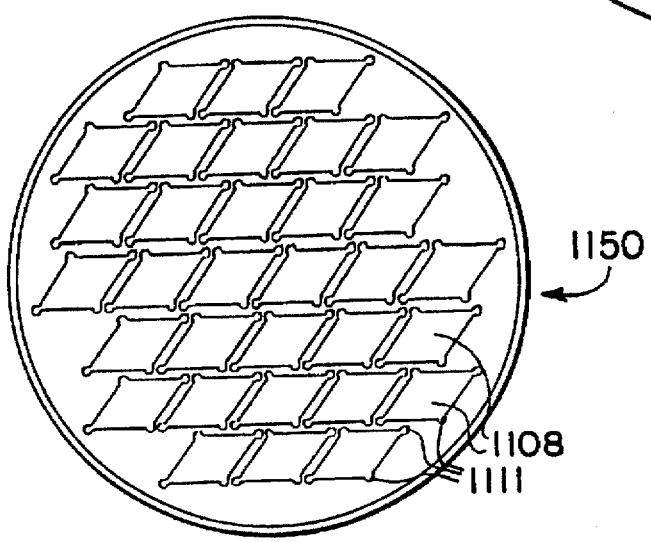

Turning to FIGS. 9–11, top plan views of three additional mandrels in accord with the invention are seen. In FIG. 9, the mandrel 950 includes a plurality of substantially square wells 908, with the corners of the wells 908 being provided with small radius circular extensions 911 which permit the entire edges of the tool inserts to be coated with synthetic diamond. In the regular arrangement of FIG. 9, all of the wells are substantially identical in configuration. In FIG. 10, the mandrel 1050 includes a first plurality of substantially rhombus-shaped (diamond-shaped) wells 1008a, and a second plurality of substantially triangular wells 1008b. Again, as in FIG. 10, all of the wells are provided with small radius circular extensions at their corners 1011. The mandrel 1150 of FIG. 11 is similar to that of FIG. 9, with all wells 1108 being substantially identical in configuration and including the small radius circular extensions 1111, except that the wells of the mandrel 1150 are rhombus in shape, and generally larger than those of FIG. 9.

Using the mandrel embodiments of the invention 150, 650, 950, 1050, 1150 (or one of similar nature), the mandrel and inserts may be placed in the arc-jet or other rotating system for deposition of synthetic diamond thereon. Because the contours and sizes (with the exception of the height) of the inserts are substantially identical to the contours and sizes of the mandrel wells, the inserts will remain in the wells during rotation. It will be appreciated that in an arc-jet system, the spinning of the mandrel ensures that a large number of inserts may be coated uniformly with diamond films whose characteristics do not vary substantially.

There have been described and illustrated herein several embodiments of a method and apparatus for coating cutting tool inserts with thin diamond films by use of a mandrel having receiving wells for holding the inserts, wherein the contour of the receiving wells is the same as that of the inserts. While particular embodiments of the invention have been described, it is not intended that the invention be limited thereto, as it is intended that the invention be as broad in scope as the art will allow and that the specification be read likewise. Thus, while the invention was described with particular reference to an arc-jet system, it will be appreciated that the mandrel invention has application to other spinning diamond deposition apparatus, and can in fact be used, if desired with low velocity or stagnant gas species equipment. Also, while generally rectangular, diamond-shaped, and triangular receiving wells have been shown, other well and substrate geometries such as circular, hexagonal or octagonal may be used. Furthermore, while particular types of mandrel substrates and substrate coatings have been disclosed, it will be understood that other mandrel substrates and substrate coatings can be used. For example, and not by way of limitation, while a titanium nitride coated molybdenum mandrel substrate has been disclosed, a titanium carbonitride coated molybdenum mandrel substrate may also be used. It will therefore be appreciated by those skilled in the art that yet other modifications could be made to the provided invention without departing from the spirit and scope of the appended claims.

I claim:

1. An apparatus for depositing diamond films on a plurality of substrates, comprising:

a mandrel having a plurality of receiving wells having contours substantially identical to the contours of the plurality of substrates, said plurality of receiving wells for receiving the plurality of substrates, wherein at least two of said receiving wells have different contours.

2. An apparatus according to claim 1, wherein:

said mandrel is circular.

3. An apparatus according to claim 2, wherein:

said mandrel is adapted to be attached to a means to rotate said mandrel about its central axis, in an arc-jet diamond film coating apparatus.

4. An apparatus according to claim 1, wherein:

said mandrel is made from molybdenum.

5. An apparatus according to claim 4, wherein:

said mandrel is coated with titanium nitride.

6. An apparatus according to claim 1, wherein:

said mandrel comprises a circular mandrel base having a flat upper surface, and a separate circular plate having said receiving wells therein, said separate plate being attached to said mandrel base upper surface.

7. An apparatus according to claim 6, wherein:

said receiving wells are holes through said circular plate.

8. An apparatus according to claim 7, wherein:

said mandrel further comprises a layer of a low melting point metal foil interposed between said mandrel base and said circular plate.

9. An apparatus according to claim 6, wherein:

said mandrel further comprises a layer of a low melting point metal foil interposed between said mandrel base and said circular plate.

10. An apparatus for depositing diamond films on a plurality of substrates, comprising:

a mandrel base having an upper surface;

a perforate plate having a plurality of holes, said plate attached to said upper surface, said holes and said upper surface defining a plurality of receiving wells for receiving the plurality of substrates.

11. An apparatus according to claim 10, wherein: said mandrel base is circular.

12. An apparatus according to claim 10, wherein:

said mandrel base is adapted to be attached to a means to rotate said mandrel about its central axis, in an arc-jet diamond film coating apparatus.

13. An apparatus according to claim 10, wherein:

said mandrel base is made from molybdenum.

14. An apparatus according to claim 13, wherein:

said mandrel base is coated with titanium nitride.

15. An apparatus according to claim 11, wherein:

said perforate plate is circular.

16. An apparatus according to claim 8, further comprising:

a layer of a low melting point metal foil interposed between said mandrel base and said perforate plate.

17. An apparatus according to claim 12, further comprising:

a layer of a low melting point metal foil interposed between said mandrel base and said perforate plate.

* * * * *